United States Patent [19]
Deak et al.

[11] Patent Number: 5,085,904
[45] Date of Patent: Feb. 4, 1992

[54] BARRIER MATERIALS USEFUL FOR PACKAGING

[75] Inventors: Gedeon I. Deak, Wilmington, Del.; Scott C. Jackson, Kennett Square, Pa.

[73] Assignee: E. I. Du Pont de Nemours and Company, Wilmington, Del.

[21] Appl. No.: 513,354

[22] Filed: Apr. 20, 1990

[51] Int. Cl.$^5$ .................. B32B 9/04; B65D 25/34; B05D 3/00
[52] U.S. Cl. .................. 428/35.7; 427/51; 428/35.9; 428/36.6; 428/446; 428/448; 428/474.4; 428/480
[58] Field of Search .............. 428/446, 448, 479.4, 428/480, 35.7, 35.9, 36.6; 427/51

[56] References Cited

U.S. PATENT DOCUMENTS

| | | | |
|---|---|---|---|
| 3,442,686 | 5/1969 | Jones | 428/336 |
| 4,528,234 | 7/1985 | Kaiho et al. | 428/216 |
| 4,552,791 | 11/1985 | Hahn | 428/35 |
| 4,702,963 | 10/1987 | Phillips et al. | 428/426 |

FOREIGN PATENT DOCUMENTS 62-156943  7/1987  Japan .

OTHER PUBLICATIONS

"Glassy Barriers from Electron Beam Web Coaters", D. Chahroudi, paper made available 4/89.

Primary Examiner—James J. Seidleck

[57] ABSTRACT

Multilayer structures suitable for food packaging is provided, wherein barrier layers of SiO and $SiO_2$ are successively vacuum deposited on a resin substrate such as PET film. This combination of silicon oxide layers provides economical, color-free, microwaveable packaging. Barrier properties of the packaging after retorting can be improved by incorporation of a dopant of metallic material in the $SiO_2$ layer.

19 Claims, 1 Drawing Sheet

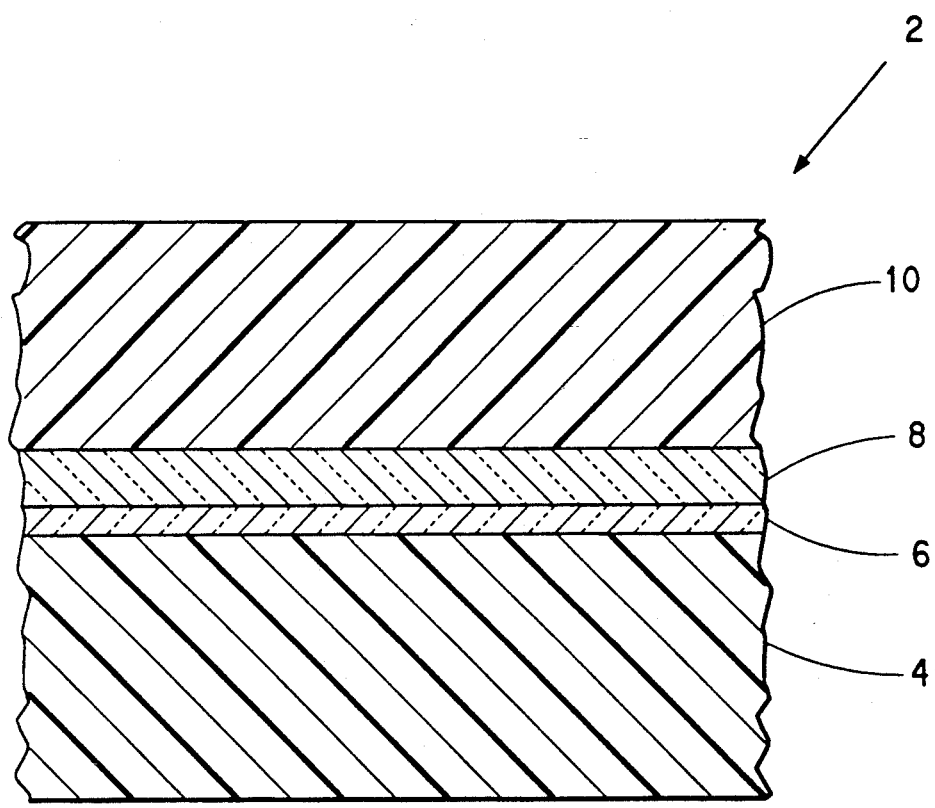

BARRIER MATERIALS USEFUL FOR PACKAGING

BACKGROUND OF THE INVENTION

1. Field of the Invention

This invention relates to improved barrier layer coatings of oxides of silicon on the surface of articles molded from certain thermoplastic organic polymers.

2. Description of Related Art

U.S. Pat. No. 3,442,686 discloses multilayer structures as flexible transparent packaging film having good barrier properties to gases and liquids, comprising a flexible transparent organic polymeric base film having thereon an adherent, transparent, flexible highly gas- and liquid-impermeable, moisture resistant, continuous glassy coating of inorganic material, and a sealable, flexible, transparent top coating of organic polymeric material. The glassy coating is sandwiched between the base film and top coating. The preferred base films disclosed include polyester films such as Mylar® oriented, heat set polyester film. The preferred glassy coatings disclosed are the oxides of silicon and aluminum, and the coating thickness is disclosed to be 0.02 to 2 microns (20 to 2000 nm). Among the silicon oxides disclosed are silicon monoxide (SiO) and silicon dioxide ($SiO_2$). The glassy coating is formed on the base film by vacuum deposition. Examples of sealable top coatings disclosed are polyethylene and vinylidene chloride/acrylonitrile copolymer.

SiO is known to have better barrier properties than $SiO_2$, but unfortunately SiO is much more expensive than $SiO_2$ and imparts a yellow color to the package in the coating thickness required for development of its good barrier properties.

Nevertheless, after all the years of passage after publication of U.S. Pat. No. 3,442,686 in 1969, a commercial product has finally been introduced (in Japan) in which the glassy coating is a layer of SiO sandwiched between two layers of polyethylene terephthalate (PET) film and a cast polyolefin top coating to form a packaging film. For one of the products, the SiO layer thickness is on the order of 2000 Angstroms (200 nm). Another product consists of a laminate in which two superimposed layers of SiO are present, each having a thickness of 1200 Angstroms (120 nm), giving a total effective SiO thickness of 2400 Angstroms (240 nm). These products have two disadvantages. First the product has a distinctly yellow color arising from the SiO layer(s) at the layer thicknesses involved, ie., SiO has a yellow color, which becomes more intense as its thickness increases. It is believed that the yellow color of the SiO coating is somewhat ameliorated by carrying out the vapor deposition of the coating in the presence of oxygen, whereby the SiO is on the order of $SiO_{1.5}$. Second, the packaging film constituting this commercial product has the disadvantage of high cost arising from the high thickness and high relative cost of SiO present in the packaging film to provide the needed barrier properties. To their credit, however, these packaging films are reported to be able to survive retorting at 125° C. without loss of barrier property.

Effort has been made to use $SiO_2$ coating instead of SiO for economy reasons and in order to obtain a colorless package. To some extent, the barrier properties of $SiO_2$ can be improved by increased thickness, but there is a limit to this approach because of decreasing flexibility with increasing thickness.

U.S. Pat. No. 4,702,963 discloses a multilayer structure in the form of a packaging film in which an adhesion layer is first vacuum deposited on a flexible polymer substrate, followed by vacuum deposition of a barrier layer, to confer retortability to the packaging film. The adhesion layer can consist of Cr, which is preferred, Ta, Ni, Mo, oxides of Cr, alloys of Cr with Ta and Ni, co-deposited mixtures of Cr and SiO having at least 20% by weight of Cr and a lead-alumina-silica glass composition, and the adhesion layer is disclosed to have a thickness of 5 to 50 Angstroms (0.5 to 5 nm). The patent discloses that the barrier is preferably silicon monoxide or silicon dioxide, and that when silicon dioxide is used, it may be mixed with glass modifiers such as oxides of Mg, Ba, and Ca, or with fluoride of alkaline earth metals, e.g., $MgF_2$ to alter the color appearance of the overall structure. A chromium/SiO composite film is disclosed to produce a coating with a yellowish appearance, while a neutral gray appearance is disclosed to result from the mixture of $SiO_2$ with glass modifiers. The specific adhesion/barrier layer systems disclosed in the Examples are primarily chromium as the adhesive layer and SiO or $SiO_2$ as the barrier layer. The lead-alumina silica glass is used as an adhesive layer, as is Ta-Cr alloy, Ta, Mo, and chromium oxides. In some Examples, the $SiO_2$ layer is mixed with a modifier. In Table 4, small changes in adhesion layer thickness are disclosed to greatly diminish light transmission. In addition, retortability is determined from a simulated test in which silicon oxide layer adhesion is reported after retorting but not any barrier property of the multilayer structure. The approach taken in this patent has not achieved commercialization.

U.S. Pat. No. 4,528,234 discloses a transparent multilayer structure comprising a plastic film having a vacuum deposited layer thereon of Al, Sn, Fe, Zn and/or Mg and then a top layer of a carboxyl-containing polyolefin layer. The metal layer is thin enough that the structure is transparent and the metal layer effects a secure bond between the plastic film and the carboxyl-containing layer. The patent also discloses that a vacuum deposited layer of silicon oxide or titanium oxide on one or both sides of the plastic film improves the barrier properties of the structure and a package made therefrom is particularly suitable for retorting. In the Examples, both silicon monoxide and silicon dioxide are used as the barrier layer. These multilayer constructions have not achieved commercialization.

Japanese patent publication 62-156943 discloses a multilayer barrier structure of multiple layers of film and multiple layers of a vacuum deposited metal such as Al, Zn, Cu, Pt, In, Sn, Au, Ag, Sn or metal compound such as silicon oxide. The layers of vacuum deposited metal or metal compound are separated from one another by a layer of film and/or a layer of adhesive.

Thus there still remains the need to improve on the presently available commercial product of a coating of SiO on PET base film and top coated with cast polyolefin, insofar as providing equivalent barrier properties at lower cost and without the distinct yellow coloration arising from the SiO layer.

SUMMARY OF THE INVENTION

The present invention satisfies these needs by providing a multilayer structure of a resin substrate of polyester or polyamide with sequentially vacuum-deposited layers of SiO and SiO$_2$ thereon. The SiO layer can be thin enough that its yellow coloration is either barely perceptible or not perceptible at all. A thicker SiO$_2$ layer is provided. The combination of these layers on the resin substrate provides a colorless barrier structure on an economical basis.

In one embodiment of the present invention the multilayer structure comprises the resin substrate of polyester or polyamide with sequentially vacuum deposited thin and thicker SiO and SiO$_2$ layers, respectively, thereon. Preferably, the thickness of the SiO layer on the substrate is about 10 to 75 nm (about 100 to 750 Angstroms) and of the SiO$_2$ layer deposited on the SiO layer is at least about 20 nm (200 Angstroms), with the thicknesses of these layers being selected to provide the barrier properties desired. The SiO layer at these small thicknesses provides virtually no barrier properties. The same is true for many of the thicknesses of SiO$_2$ except at the higher thicknesses. Together, however, these layers provide barrier properties better than the sum of the individual layers.

In another embodiment of the present invention, the foregoing-described SiO$_2$ layer incorporates a dopant selected from a wide variety of metallic materials which have the effect of improving the retortability of the multilayer structure as measured by barrier properties, instead of by a simulated retortability test involving only adhesion testing. The dopant improves the pre-retort barrier properties of the SiO$_2$ layer if no SiO underlayer were present. In the present invention, however, wherein the SiO underlayer is present, the dopant does not appear to appreciably affect pre-retort barrier properties. Instead, the presence of the dopant used in accordance with the present invention tends to stabilize these properties so that they carry over into the retorted multilayer structure.

Another embodiment of the present invention is the process for making a barrier structure from polyester or polyamide polymer as the resin substrate by carrying out the sequential vacuum deposition to form the SiO and SiO$_2$ combination of layers described above.

DESCRIPTION OF THE DRAWING

The drawing is a schematic cross section of a length of multilayer structure 2 of the present invention, comprising a resin substrate 4 having a layer 6 of SiO vacuum deposited thereon, and a layer 8 of SiO$_2$ vacuum deposited in the SiO layer. In the preferred embodiment a protective outer layer 10 of adherent plastic resin is present in the multilayer structure.

DESCRIPTION OF PREFERRED EMBODIMENTS

The resin substrate is selected so as to be compatible with to the SiO layer. It has been found that resin substrates of polyester or polyamide provide this compatibility. Usually, semicrystalline polyester or polyamide resin substrates will have been oriented, and this may be followed by heat setting so as to provide dimensional stability for those multilayer structures that will be exposed to heat that would otherwise cause the structure to shrink. Examples of polyester resin include polyethylene terephthalate (PET), polyethylene napthalate, polyarylate and polycarbonate. Examples of polyamide resin include the semicrystalline polyamides, such as polycaprolactam or condensation polymers of dicarboxylic acids and diamines, e.g. polyhexamethylene adipamide, and the amorphous polyamides.

Examples of amorphous polyamides include hexamethylenediamine isophthalamide, hexamethylenediamine isophthalamide/terephthalamide terpolymer, having iso/terephthalic moiety ratios of 100/0 to 60/40, mixtures of 2,2,4- and 2,4,4-tri-methylhexamethylenediamine terephthalamide, copolymers of hexamethylene diamine and 2-methylpentamethylenediame with iso- or terephthalic acids, or mixtures of these acids. Polyamides based on hexamethylenediamine iso-/terephthalamide containing high levels of terephthalic acid moiety may also be useful particularly when a second diamine such as 2-methyldiaminopentane is incorporated to produce a processable amorphous polymer.

Preferably the surface of the resin substrate which will receive the SiO layer will be smooth, e.g. having a surface roughness of less than about 50 nm as measured by an optical profilometer, obtainable for example from Wyco. Resin substrates in the form of films are commercially available having a surface roughness of less than about 20 nm. Commercially available Mylar® D (PET) film has a surface roughness of less than about 10 nm, generally to 7 nm. Such smooth film is made by conventional processes for making biaxially oriented film, especially PET film, except that no internal slip additive is present in the film. Instead, the process of U.S. Pat. No. 3,808,027 can be practiced on the film to provide minute silica nodules on one surface to provide slip properties for the film, there being no nodules present on the opposite surface to mar the smoothness resulting from conventional manufacture. In accordance with the present invention, the SiO layer is preferably deposited on the smooth side of the film. Smooth resin substrates in film or other form and of PET or other resins can be made by conventional processes.

Vacuum deposition of SiO and SiO$_2$ materials to form a layer on a substrate is a conventional process such as by evaporation of the silicon oxide or sputtering. The evaporative process can be performed using thermal processes such as resistance heating, electron beam heating, or induction heating of the silicon oxide source. This causes the source to vaporize and then deposit on the resin substrate positioned in the vacuum chamber. In sputtering, an ion beam or magnetically confined plasma (magnetron) displaces material from the silicon oxide target, causing this displaced material to deposit on the resin substrate or the SiO layer on the resin substrate, as the case may be. Sometimes these processes are referred to as vapor deposition, but the term "vacuum deposition" is used herein to describe these processes, since both the evaporative process and sputtering are carried out in a vacuum. The background pressure of oxygen present in the vacuum chamber may be altered as desired to control the oxygen to silicon ratio in the SiO or SiO$_2$ deposited layer.

The area of the substrate to be coated is positioned either in a continuous process or batch process in a chamber within which a vacuum is drawn. When the resin substrate is in the form of a film, the film may be made unaccessible to the vacuum deposition on one surface of the film so that only the opposite surface receives the vacuum deposited layers. When the resin substrate is in the form of a container, the entire container can be positioned within the vacuum chamber. The surface of the resin substrate, exterior or interior, facing the sourse receives the vacuum deposited coatings. The resin substrate can be repositioned and the coating operations repeated to cover additional surface, such as the opposite side, of the substrate. U.S. Pat. No. 4,552,791 discloses a vacuum deposition arrangement for coating containers with SiO or other oxides, disclosing titanium oxide and aluminum oxide. This vacuum deposition arrangement can be used in the practice of the present invention.

The silicon oxide source is placed in the vacuum chamber and then exposed to the evaporative or sputtering process. The oxide displaced from the source then forms the coating desired on the resin substrate. The thickness of the coating is determined by the residence time of the substrate in the chamber and/or the active area of silicon oxide source present in the chamber relative to the area of substrate present in the chamber and the energy applied per unit of target area.

In accordance with the present invention, the SiO coating is deposited on the resin substrate first, followed by deposition of the $SiO_2$ coating onto the SiO layer. In a continuous process, this will be carried out in successive vacuum chambers or in successive vacuum deposition stations in a single vacuum chamber. The same station may be used in a batch process, with the SiO target being replaced by the $SiO_2$ target.

Sufficient vacuum is drawn within the vacuum chamber so that the mean free path of the silicon oxide molecules is sufficient to reach and therefore enable deposition of the SiO and $SiO_2$ layers on the resin substrate to occur. The vacuum used in the experiments described in the Examples herein generally fell within the range of about 1 to 100 microtorr (760 torr=1 atm). One skilled in the art will know how to select the proper vacuum for a given vacuum deposition process, including its conditions of operation.

In the SiO layer, SiO is the essential component. Cr as required in the adhesion layer in U.S. Pat. No. 4,702,963 when SiO is used therein is not required in the present invention. The SiO need not be entirely monoxide, however, since a minor proportion of $SiO_2$ may be present either by virtue of carrying out the vacuum deposition in the presence of $O_2$ or by having $SiO_2$ present as a minor proportion of the SiO target. The $SiO_2$ diluent in the SiO layer tends to eliminate any perceptible yellow color from the greater thicknesses within the 10 to 75 nm layer thickness range employed in the present invention. As thickness of the SiO layer increases within this range, both the tendency towards yellow coloration and cost increase, which can be essentially offset by incorporating a minor proportion of $SiO_2$ in the SiO layer or by other means increasing the atomic ratio of oxygen to silicon. Preferably, the ratio of oxygen to silicon in the SiO layer does not exceed about 1.4 and more preferably, does not exceed 1.25. The ratio of oxygen to silicon can also be less than 1:1, e.g., as low as 0.6 to 1, as can be obtained by using silicon as the source and reacting it with oxygen during the vacuum deposition process. Thus the new SiO layer can have oxygen/silicon ratios in the range of 0.6 to 1.40:1. Excessive amounts of $SiO_2$ or greater proportions of oxygen in the SiO layer tend to detract from barrier properties of the combined layers. It is essential that some thickness of SiO layer be present, since it is the combination of resin substrate and the SiO and $SiO_2$ layers that provides the desirable barrier properties. The preferred SiO layer thickness is about 10 to 50 nm.

The $SiO_2$ layer will generally not require a thickness of greater than about 500 nm (5000 Angstroms) and preferably has a thickness of about 50 to 350 nm (500 to 3500 Angstroms). The stoichiometry of the $SiO_2$ layer may vary from the oxygen/silicon ratio of 2:1 such as by reactions which may occur during the vacuum deposition process. The $SiO_2$ layer also preferably is "doped" with an effective amount of metallic material which improves the barrier properties of the layer during retorting as compared to barrier properties without dopant being present, and preferably substantially stabilizes the barrier properties so that they do not appreciably deteriorate upon retorting. For demanding barrier utilities, the doped $SiO_2$ layer in combination with the SiO layer provides results equivalent to SiO at similar overall thickness but without the high cost of SiO. It has been discovered that the magnesium, and barium modifiers for $SiO_2$, disclosed in U.S. Pat. No. 4,702,963 in fact improve the barrier property of the $SiO_2$ layer. It has also been discovered that certain materials not disclosed in that patent, such as Ti, Zr, Zn, Al, In, Pb, W, Cu, Sn, Cr, Fe, Mn, Sb, and Co or oxides, halides, such as chlorides and fluorides, and carbonates, thereof or mixtures thereof vacuum deposited with the vacuum deposition of the $SiO_2$ layer also similarly improve the barrier properties of the layer. Generally the effective amount of metal dopant which improves the barrier properties of the $SiO_2$ layer will be within the range of about 0.5 to 30% based on the total weight of the layer, and preferably 2 to 15% based on the weight of the layer depending on the particular dopant used and the barrier result desired.

The dopant can be incorporated into the $SiO_2$ layer either by evaporating a single source of a physical or fused mixture of the dopant and $SiO_2$, or by co-depositing the dopant and the $SiO_2$ from two or more sources simultaneously. In both cases, the dopant can be in a metallic form, or in the form of an oxide, silicide, silicate, halide or carbonate and the like. In the case of depositing from a single source, the proportion of the dopant present in the deposited $SiO_2$ layer may vary from the composition of the source. Such proportion can be determined for a particular source composition and conditions of vacuum deposition and can be adjusted to the proportion desired by adjustment of the source composition. In case of either deposition method, the composition of the coating can be determined by analysis of atomic absorption using inductively coupled plasma (ICP), which is a conventional analysis procedure. This analysis primarily detects the elemental metal in the $SiO_2$. Therefore, the weight percents of dopant disclosed herein are based on the elemental metal of the metal dopant. Thus, decomposition products, e.g. $CO_2$ from carbonates, which do not become part of the $SiO_2$ layer are not included in weight percents of dopant in the $SiO_2$ layer. The weight percents of dopant disclosed herein refer to the composition of the $SiO_2$ layer unless otherwise indicated. These same weight percents may, however, be present in the source(s) for vacuum deposition (co-deposition), and as previously described, the resultant composition of the $SiO_2$ layer for the vacuum deposition conditions used can then be determined, and the source composition can then be adjusted in subsequent runs to obtain the final $SiO_2$ composition desired. More often, the source composition will be adjusted to provide the barrier properties desired for the multilayer structure rather than to analyze the $SiO_2$ layer for its dopant content.

The oxidation state of the metal as it resides in the coating matrix of silicon dioxide is not necessarily clearly understood or well defined. Thus if an elemental metal is used as the source for the dopant, the deposited metal atoms or particles may interact with the oxygen atoms on the matrix to form a partially or completely oxidized material. Alternatively, if an oxide of the metal is used as the source, it is not necessarily known nor is it necessarily important whether the metal is deposited into the glassy matrix as the oxide or as the elemental metal. Despite the presence of dopant in the $SiO_2$ layer, multilayer structures of the present invention using this embodiment, such structures can be used in microwave food packaging without any appreciable blocking of microwave energy from reaching the food during microwave cooking.

Contrary to the light transmission results reported in U.S. Pat. No. 4,702,963, the light transmission of multilayer structures of the present invention are high, preferably not appreciably degrading the light transmission of the resin substrate. The $SiO_2$ layer, even containing metallic material dopant can be and is preferably colorless, so that the entire multilayer structure is colorless.

As previously stated herein, the metal dopant appears to have the effect of enabling the barrier properties of the multilayer structure to survive retorting, e.g. prolonged contact with boiling water under pressure at temperatures at least 125° C.

One measure of improved barrier properties is reduced oxygen transmission through the multilayer structure.

Multilayer structures of the present invention can achieve barrier properties characterized by an oxygen transmission rate (OTR) of less than about 7 $cc/m^2$ Day Atm, preferably before and after retorting. The preferred oxygen transmission rate before and after retorting is less than about 3 $cc/m^2$ Day Atm. The oxygen transmission is measured on a Model "OX-TRAN 1000" made by Modern Controls Inc. of Minneapolis MN in accordance with ASTM test D 3985-81 (1988) except that the test is carried out at 30° C. and at 80% relative humidity, using 100% (1 Atm pressure) oxygen, with the result being normalized to 1 $m^2$ of multilayer structure and one day,s duration for the test. The retorting procedure used for these tests involves placing the multilayer structure in a bath of water in an autoclave under 2.5 Atm absolute pressure at 125° C. for 30 minutes in addition to the time for heating up (30 minutes) and cooling down (15 minutes) the water bath in which the multilayer structure is immersed.

The other barrier property of primary interest in food packaging is the barrier to water vapor. Multilayer structures of the present invention also exhibit low permeability to passage of water vapor, both before and after retorting. Preferably, the water vapor transmission of multilayer structures of the present invention is no greater than about 5 $g/m^2$ from 90% relative humidity to 50% relative humidity, and more preferably no greater than about 3 $g/m^2$ (same relative humidity conditions) as measured by ASTM-F 1249.

The protective layer can be selected from any plastic resin that adheres to the $SiO_2$ layer or that adheres to the $SiO_2$ layer via an intervening adhesive layer. Preferably this adhesion will survive retorting process as well. Examples of protective layers include a layer of polyester adhered to the $SiO_2$ layer via an adhesive, polyvinylidene chloride, polyethylene, polypropylene, ethylene/vinyl acid copolymer, ethylene/acrylic or methacrylic acid copolymer, ionomer, copolymers of acrylonitrile, and polyamide. The protective layer can be applied to the $SiO_2$ layer by conventional processes such as adhesive or thermal laminating or extrusion coating onto the $SiO_2$ layer simultaneous with extrusion of the intervening adhesive, if any. The protective layer can also be provided by solvent or dispersion coating onto the $SiO_2$ layer, using multiple coatings if thickness is greater than achievable by single coating is desired. The thickness of the protective layer will generally be about 0.5 to 100 microns thick, preferably 10 to 25 microns (0.010 to 0.025 mm). In one embodiment, the protective layer is biaxially oriented PET film (0.0234 mm thick), which is laminated to the exposed surface of the $SiO_2$ layer via a co-polyester adhesive resin available as Adcote 506-40 (2.7 $g/m^2$) from Morton Chemicals and a nip roll heated at 120° C. for pressing the film and laminate structure against one another.

The resultant laminates of the present invention are useful as a wide variety of packaging, from rigid to semi-rigid containers to flexible packaging film, which will dictate the choice and shape of the resin substrate. For packaging film, the resin substrate will be in the form of a film generally having a thickness of about 8 to 150 microns, often 12 to 50 microns or preferably about 12 to 25 microns (0.012 to 0.025 mm). The high light transmission and colorless appearance of packaging of multilayer structures serves as a good showcase for food packaged therein, and the high barrier properties of such packaging provides excellent preservation of this food.

Examples of the present invention are as follows (parts and percents are by weight unless otherwise indicated):

EXAMPLE 1

This Example demonstrates the necessity of the SiO/$SiO_2$ multilayer combination in terms of barrier properties.

Layers of the silicon oxides were formed by electron beam evaporation on the side of Mylar ® D PET film (0.0234 mm thick) without slip nodules to form a barrier film.

Details of the electron beam evaporation procedure are as follows: the electron beam evaporator used was the type using a single crucible bent beam source. There are several different manufacturers of equipment providing this beam source, e.g., Leybold AG, Alzenau, West Germany; Balzers AG, Furstentum Liechtenstein; Temescal of Berkeley, Calif.; or Denton Vacuum of Cherry Hill, N.J., the latter being used in this Example.

The accelerator voltage was continuously adjusted to sweep the electron beam across the material in the crucible forming the hearth of the electron beam evaporator to give a uniform erosion of the crucible's silicon oxide contents. The filament current (and subsequently the beam current) was adjusted to give a high deposition rate which resulted in a relatively high background pressure of about $1 \times 10^{-3}$ torr. This pressure was not so high as to cause premature arc over of the electron beam gun. The thickness of the deposits were monitored by a calibrated oscillating quartz crystal monitor such as made by Veeco Instruments Inc., Plainview, N.Y., and the vacuum deposition process was stopped when the desired oxide layer thickness was reached.

The results of the experiments reported under this Example are shown in Table 1.

TABLE 1

Barrier Film O₂ Permeability

| | SiO layer thickness (nm) on the PET film | SiO₂ layer thickness (nm) on the SiO layer | OTR (no retort) (cc/m² Day Atm) |
|---|---|---|---|
| a. | 31 | 0 | 43.2 |
| b. | 0 | 355 | 10.1 |
| c. | 0 | 301 | 76.4 |
| d. | 0 | 303 | 77.1 |
| e. | 0 | 314 | 7.1 |
| f. | 0 | 300 | 84.3 |
| g. | 0 | 315 | 62.1 |
| h. | 30 | 202 | 1.1 |
| i | 102 | 184 | 2.3 |
| j. | 35 | 237 | 1.2 |
| k. | 15 | 214 | 2.5 |

OTR is the cc of O₂ transmitted across the multilayer structure in one day with a partial pressure difference of one atmosphere of oxygen, under the further conditions described hereinbefore. In this Example, the OTR was determined on unretorted barrier film.

Experiments h., j., and k. are examples of the present invention and provide the lowest oxygen permeability, demonstrating the best barrier properties when the combination of SiO and SiO₂ layers are used.

Experiment a. shows that the thin layer of SiO by itself on the PET film substrate provides poor barrier property. The film by itself exhibits an oxygen permeability of 75 cc/m² Day Atm.

Experiments b. through g. show that the thicker SiO₂ layers used by themselves (no SiO underlayer) provide variable oxygen permeability results as compared to Experiment a., i.e., sometimes better, sometimes worse.

The combination of SiO and SiO₂ layers, however, as shown in experiments h., j., and k. provides better barrier properties than demonstrated by either the SiO or SiO₂ layers used separately, with a more than 200% improvement over the best results exhibited by the SiO₂ layers used by themselves (on PET film).

Experiment i. demonstrates that thicker SiO and thinner SiO₂ layers may be used in the combination but at sacrifice in economy because of the greater cost of SiO as compared to SiO₂ and color. The multilayer film structures of experiments h., j., and k. are transparent and colorless as are the film structures of experiments a. through g., while the film structure of experiment i. exhibits yellow coloration.

EXAMPLE 2

A multilayer film structure of a layer of 31 nm thickness of SiO on the PET film used in Example 1 and a layer of 202 nm thickness of SiO₂ on the SiO layer was prepared in the same manner as Example 1 and the resultant colorless barrier film was subjected to retorting by placement in a bath of water in an autoclave at 125° C. for 30 minutes. While the film was unchanged in visual appearance to the naked eye, the OTR of the film degraded to 39.8 cc/m² day Atm, suggesting that this combination should be used where the film structure would not be subjected to retorting, e.g., for packaging tea, coffee, cereals, and cigars.

EXAMPLE 3

This example shows the effect of varying the stoichiometric ratio of oxygen to silicon in the SiO underlayer formed on the PET film. The multilayer structure: PET film/SiO/SiO₂, by the procedure of Example 1, using the PET film used in that Example, with the following results:

TABLE 2

| | SiO | SiO₂ | OTR |
|---|---|---|---|
| Ratio of O:Si | Layer thickness (nm) | Layer thickness (nm) | (after retort) (cc/m² Day Atm) |
| 1.25:1 | 54 | 283 | 0.9 |
| 1.5:1 | 31 | 240 | >150 |

In the experiments addressed in Table 2, the SiO₂ layer was doped with Sn by vacuum deposition by electron beam evaporation of a 95/5 weight source mixture of SiO₂ and Sn. The SiO layer was formed to contain the greater proportion of oxygen as indicated in Table 2 by mixing SiO and SiO₂ together in the weight ratio indicated to form a single source (target). The permeability testing was carried out after retorting of the film structure by the procedure described in Example 2. From these results it can be seen that as the oxygen ratio increases in the SiO underlayer, the retortability of the multilayer structure decreases.

EXAMPLE 4

This Example shows the effect of SiO layer thickness on barrier properties for PET film/SiO/SiO₂ multilayer film structure by the procedure of Example 1, using the PET film used in that Example, with the following results:

TABLE 3

| SiO layer thickness nm | SiO₂ layer thickness | OTR (after retort) (cc/m² Day Atm) |
|---|---|---|
| 2 | 238 | 81.0 |
| 5 | 241 | 84.9 |

The SiO₂ layer in this Example was doped with 5% Sn in the same manner as reported for Table 2 and the oxygen permeability was determined after the film structure had been retorted as described in Example 2. This retorting virtually destroyed the barrier property of the film structure whereas for the thicker SiO layer used in the first experiment of Table 2, excellent barrier property was exhibited after retorting even though the SiO layer was somewhat diluted by its 1.25:1 O₂ to Si ratio.

EXAMPLE 5

In this example, the film structure PET film/ 13 nm SiO/308 nm SiO₂+5% Cu (source mixture) was prepared and tested for oxygen permeability by the same procedure as Example 1, but after retorting by the procedure of Example 2, and the resultant OTR was 2.8 cc/m² day Atm indicating that a moderately thin SiO layer serves to provide reasonably good barrier property in combination with the SiO₂ layer.

EXAMPLE 6

A 49 nm thick layer of SiO was formed onto a 92 gauge (0.0234 mm) 'Mylar D" PET film by electron beam evaporation in a vacuum chamber as described in Example 1. The deposit was transparent and exhibited a yellow color which was barely perceptible. A second layer, 250 nm thick of SiO₂ mixed with 5% MgF₂ dopant (Mg weight basis) as the source in the hearth of the electron beam evaporator, was formed on top of the SiO layer by electron beam evaporation. The resultant barrier film was transparent, clear and colorless. This coated film was then retorted by placing it into a bath of water in an autoclave at 125° C. for 30 minutes. The retorted film's oxygen transmission rate (OTR) was 1.04 cc/m$^2$ day atm, and the film retained the transparent, clear, and colorless appearance present in the un-retorted film.

For comparison purposes, SiO$_2$ was mixed with 5% MgF$_2$ (Mg weight basis). This mixture was loaded in the hearth as the source of an electron beam evaporator. A film of approximately 301 nm was formed directly onto a 92 gauge "Mylar D" PET film (on the side without the slip nodule additive) by electron beam evaporation from this mixture. The deposit was transparent and clear. This coated film was then retorted by placing it into a bath of water in an autoclave at 125° C. for 30 minutes. The retorted film's oxygen transmission rate (OTR) was measured as 94 cc/m$^2$/day Atm which was even greater than the barrier quality of the of "MYLAR" base film without the SiO$_2$ layer. Furthermore, instead of being a clear film, the SiO$_2$ layer while still transparent, exhibited a great amount of crazing or many small cracks. Repetition of the experiment to obtain a SiO$_2$ layer 301 nm thick but without the MgF$_2$ dopant gave similarly poor barrier property, except that the SiO$_2$ layer had good adhesion to the PET film as indicated by high peel strength (152 g/cm), and was transaprent and colorless, without any cracks or crazing being visible to the naked eye.

EXAMPLE 7

A 50 nm film iof SiO was deposited onto a 92 gauge "Mylar D' PET film (on the side without the slip additive) by electron beam evaporation. The deposit was transparent. A second layer, 252 nm of SiO$_2$ mixed with 5% Sn dopant (in the harth of the electron beam evaporator), was deposited on top of the SiO layer by electron beam evaporation. The film remained transparent and clear after this second deposit. This coated film was then retorted by placing it into a bath of water in an autoclave at 125° C. for 30 minutes. The retorted film's oxygen transmission rate (OTR) was measured as 97 cc/m$^2$ Day Atm, which was greater than the barrier property of the base film by itself. Furthermore, instead of being a clear film, the glass deposit exhibited a great amount of crazing or many small cracks.

EXAMPLE 8

Following the procedure of the first paragraph of Example 7, except that the SiO layer was 31 nm thick and the SiO$_2$ layer contained 5% Cu (source composition) and was 273 nm thick, gave an oxygen transmission rate after retorting of 3.078 ccm$^2$ Day Atm. For another sample of coated resin substrate, the thickness of the SiO layer was 51 nm and of the the SiO$_2$/Cu layer was 250 nm and the oxygen transmission rate for this sample was 6.624 cc/m$^2$ Day Atm.

EXAMPLE 9

In this Example, the resin substrate was a polyester film of poly(ethylene-2,6-naphthalene dicarboxylate) (PEN) which had a rough surface characterized by visible ripples present in the film surface. A barrier film was formed by the vacuum deposition procedure of Example 1 with an SiO underlayer 50 nm thick on the PEn film and SiO$_2$ top layer containing 5% Sn (source composition) and measuring 125 nm thickn on the SiO underlayer. The OTR of the film prior to retorting was 1.6 cc/m$^2$ Day Atm and after retorting was 12.5 cc/m$^2$ Day Atm. The OTR of the PEN film by itself was 23 cc/m$^2$ Day Atm.

EXAMPLE 10

A number of barrier films of the structure PET film-/SiO/SiO$_2$ were formed by vacuum deposition by the procedure of Example 1, in which the PET film was Mylar D and the SiO$_2$ layer contained various dopants (source compositions reported based on the elemental metal of the dopant), and on which OTR values were obtained either before or after retorting in accordance with Example 2. The results are shown in Table 4.

TABLE 4

| | | SiO$_2$ layer | | OTR | OTR |
|---|---|---|---|---|---|
| No. | SiO layer thickness (nm) | thickness (nm) | dopant (wt %) | before retort (cc/m$^2$ Day Atm) | after retort (cc/m$^2$ Day Atm) |
| a. | 32 | 270 | 10 Cr | 0.93 | — |
| b. | 35 | 280 | 10 Cr | — | 1.33 |
| c. | 30 | 217 | 10 Fe | 7.49 | — |
| d. | 30 | 272 | 10 Fe | — | 6.59 |
| e. | 57 | 254 | 5 In | 0.42 | — |
| f. | 50 | 252 | 5 In | — | 5.84 |
| g. | 30 | 273 | 5 Mn | — | 3.27 |
| h. | 31 | 273 | 10 Mn | — | 47.8 |
| i. | 51 | 250 | 5 PbO | — | 4.37 |
| j. | 26 | 278 | 5 SnO$_2$ | 1.07 | — |
| k. | 29 | 277 | 5 Zr | 5.07 | — |
| l. | 26 | 279 | 20 Zr | 0.74 | — |
| m. | 25 | 279 | 5 ZrO | 0.50 | — | oxygen transmission rate (OTR) was measured as 0.65 cc/m$^2$ Day Atm and the film retained its transparency and clarity.

For comparison purposes, SiO$_2$ was mixed with 5% of Sn. This mixture was loaded in the hearth of an electron beam evaporator. A film of approximately 296 nm was formed onto a 92-gauge "Mylar D" PET film (on the side without the slip additive) by electron beam evaporation from this mixture. The deposit was transparent and clear. This coated film was then retorted by placing it into a bath of water in an autoclave at 125° C. for 30 minutes. The retorted film's oxygen transmission The experiment k., the PbO was supplied in the form of a fused glass designated SF-6 available from Schott Glass Technologies, Inc. Curyea, PA., and contained a small proportion of SiO$_2$.

Comparison of experiments a. with b. and c. and d. show stabilizing effect of the dopants in the amounts used on oxygen permeability before and after retorting. The element In was less effective in the amount used, but the result after retorting was still more than 10 times better than the PET film by itself.

Mn as the dopant in experiment g. produced a barrier film with a useful oxygen impermeability after retorting, while the OTR value for experiment h. suggests that too much Mn was present in the SiO$_1$ layer.

Experiments j. through m. all gave barrier layers with useful oxygen impermeabilities.

EXAMPLE 11

In this Example, The SiO underlayer was replaced by an SiO$_2$ layer to yield the following multilayer film structure: PET film/32 nm SiO$_2$/271 nm SiO$_2$+5% Cu (source compositions). The PET film was Mylar D. The vacuum deposition procedure of Example 1 was used and the retort procedure of Example 2 was used. The OTR of this structure after retorting was 92.5 cc/m$^2$ Day Atm. The structure was clear and transparent, giving no visual evidence that the oxygen barrier had failed. In addition, the SiO$_2$ layers were strongly adhered to the PET film as indicated by a peel strength of 144.5 g/cm exhibited by a nearly identical film structure.

EXAMPLE 12

This Example shows the high transparency and low water vapor transmission of a number of multilayer structures of the present invention prepared by the procedure of Example 1 using the PET film of that Example as the resin substrate, details of these structures and light transmissions being reported in Table 5 (light transmission) and Table 6 (water vapor transmission).

TABLE 5

| | Visible Light Transmission | | | |
|---|---|---|---|---|
| | SiO$_2$ Layer | | % Light Transmission | |
| SiO Layer thickness(nm) | thickness(nm) | dopant (wt %) | 400 nm | 550 nm |
| 24 | 271 | 5 Cu | 72.06 | 88.24 |
| 25 | 125 | 5 Sn | 77.61 | 87.36 |
| 50 | 252 | 5 Sn | 77.33 | 78.28 |
| 32 | 270 | 10 Cr | 77.74 | 89.85 |
| 30 | 272 | 10 Fe | 69.02 | 77.16 |
| 57 | 254 | 5 In | 75.60 | 88.47 |
| 30 | 273 | 5 Mn | 73.66 | 80.17 |

These light transmissions compare favorably with the light transmission of the PET film used as the resin substrate, which by itself exhibited light transmissions of about 86% (400 nm) and almost 92% (550 nm) and especially favorably with the light transmissions of PET commodity packaging film, viz, about 69% (400 nm) and about 78% (550 nm). The transmission of the Sn, Fe, and Mn containing structures were measured after retorting by the procedure of Example 2.

TABLE 6

| | Water Vapor Transmission | | |
|---|---|---|---|
| | SiO$_2$ Layer | | Water Vapor Transmission (g/m$^2$ from 90% rel. hum. to 50% rel.hum. |
| SiO Layer thickness(nm) | thickness(nm) | dopant (wt %) | |
| 32 | 272 | 5 Cu | 0.93 |
| 10 | 300 | 5 Cu | 2.48 |
| 27 | 277 | 5 Sn | 1.40 |
| 31 | 273 | 5 Cu | 1.24* |
| 36 | 281 | 5 Sn | 1.24* |
| 49 | 250 | 5 MgF | 0.78* |

*WVTR after retorting

In this Example, the metal dopant concentration is based on the source composition. Experience has shown that the relationship between the source composition and the SiO$_2$ layer composition is such that generally the proportion of dopant in the SiO$_2$ layer composition will be from about 40 to 150% greater than the proportion of dopant present in the source. From this relationship, the proportion of dopant in the SiO$_2$ layers formed in the foregoing Examples can be estimated.

As many widely different embodiments of this invention may be made without departing from the spirit and scope thereof, it is to be understood that this invention is not limited to the specific embodiments thereof except as defined in the appended Claims.

What is claimed is:

1. A multilayer structure comprising a resin substrate of polyester or polyamide, a vacuum deposited layer of SiO of about 10 to 75 nm thickness on said substrate, and a vacuum deposited layer of SiO$_2$ of at least about 20 nm thickness on said SiO layer.

2. The multilayer structure of claim 1 wherein the thickness of said SiO layer is about 10 to 50 nm and the thickness of said SiO$_2$ layer is about 50 to 350 nm.

3. The multilayer structure of claim 1 wherein said SiO layer has an atomic ratio of oxygen to silicon in said layer of from 0.6:1 to 1.4:1.

4. The multilayer structure of claim 1 wherein said SiO$_2$ layer contains an effective amount of dopant to improve its barrier properties upon retorting of said multilayer structure.

5. The multilayer structure of claim 4 wherein said dopant is a metallic material selected from the group consisting of Ti, Zr, Zn, Al, In, Pb, W, Cu, Sn, Cr, Fe, Mn, Sb, Co, Ba, and Mg, and mixtures thereof, and the amount thereof present in said SiO$_2$ layer is about 0.5 to 30% based on the total weight of the layer.

6. The multilayer structure of claim 1 wherein said dopant is a metallic material is selected from the group consisting of Ti, Zr, Zn, Al, In, Pb, W, Cu, Sn, Cr, Fe, Mn, Sb, and Co.

7. The multilayer structure of claim 4 wherein said dopant is a metallic material selected from the group consisting of Sn and Cu.

8. The multilayer structure of claim 1 and additionally a protective plastic layer on said SiO$_2$ layer.

9. The multilayer structure of claim 1 having an oxygen transmission rate (OTR) of less than about 7 ccm/$^2$ Day Atm.

10. The multilayer structure of claim 1 having an oxygen transmission rate (OTR) of less than about 3 cc/m$^2$ Day Atm.

11. The multilayer structure of claim 10 wherein said oxygen transmission rate is present both before and after retorting.

12. The multilayer structure of claim 1 wherein said resin substrate is a film having a surface roughness of less than about 50 nm.

13. The multilayer structure of claim 12 wherein said film has a surface roughness of no greater than about 10 nm.

14. The multilayer structure of claim 1 in the form of a film.

15. The multilayer structure of claim 1 in the form of a container.

16. A process for forming a barrier structure from a resin substrate of polyester or polyamide polymer comprising vacuum depositing a layer of SiO of about 10 to 75 nm thickness on said resin substrate and vacuum depositing a layer of SiO$_2$ of at least about 20 nm thickness on said SiO layer, the resultant multilayer structure having an oxygen transmission rate (OTR) of less than about 7 cc/m$^2$ Day Atm.

17. The process of claim 16 wherein metal dopant is vacuum deposited along with the vacuum deposition of said layer of SiO$_2$ so that said metal dopant is incorporated in said SiO$_2$ layer in effective amount to provide said OTR after retorting of said structure.

18. The process of claim 16 wherein said resin substrate is in the form of a film.

19. The process of claim 16 wherein said resin substrate is in the form of a container.

* * * * *